(12) United States Patent
Olcen et al.

(10) Patent No.: US 6,784,760 B2
(45) Date of Patent: Aug. 31, 2004

(54) STEP ATTENUATOR USING FREQUENCY DEPENDENT COMPONENTS AND METHOD OF EFFECTING SIGNAL ATTENUATION

(75) Inventors: Ahmet Burak Olcen, Syracuse, NY (US); Henry Pixley, East Syracuse, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 0 days.

(21) Appl. No.: 10/287,866

(22) Filed: Nov. 6, 2002

(65) Prior Publication Data

US 2004/0085156 A1 May 6, 2004

(51) Int. Cl.[7] .................................................. H03H 7/01
(52) U.S. Cl. ........................ 333/176; 333/172; 333/185
(58) Field of Search ................................. 333/175, 185, 333/168, 172

(56) References Cited

U.S. PATENT DOCUMENTS

| | | | |
|---|---|---|---|
| 4,397,037 A | 8/1983 | Theriault | |
| 4,937,865 A | 6/1990 | Barany | |
| 4,963,966 A | 10/1990 | Harney et al. | |
| 5,130,664 A | 7/1992 | Pavlic et al. | |
| 5,379,141 A | 1/1995 | Thompson et al. | |
| 5,404,161 A | 4/1995 | Douglass et al. | |
| 5,425,027 A | 6/1995 | Baran | |
| 5,434,610 A | 7/1995 | Loveless | |
| 5,481,389 A | 1/1996 | Pidgeon et al. | |
| 5,745,838 A | 4/1998 | Tresness et al. | |
| 6,031,432 A | 2/2000 | Schreuders | |
| 6,323,743 B1 | * 11/2001 | Zelenz et al. | ................ 333/185 |

* cited by examiner

*Primary Examiner*—Robert Pascal
*Assistant Examiner*—Dean Takaoka
(74) *Attorney, Agent, or Firm*—Wall Marjama & Bilinski

(57) ABSTRACT

A filter circuit directed primarily to use in the CATV industry includes at least one frequency dependent component, such as an RF choke, capacitor or inductor, for attenuating signals over at least a portion of the frequency range of signals which pass through the filter. In a typical application, signals are transmitted and received in both forward and return paths at each end of a multi-channel, two-way communication system. Signals in the frequency range of the return path, or of both paths, are attenuated by a desired amount, which is essentially constant over the frequency range of attenuation. In any case, the circuit component providing the attenuation is frequency dependent, thus providing a number of advantages, such as reducing the number of circuit components, reducing filter size and cost, and/or increasing the filter's electric surge and power handling capabilities.

24 Claims, 6 Drawing Sheets

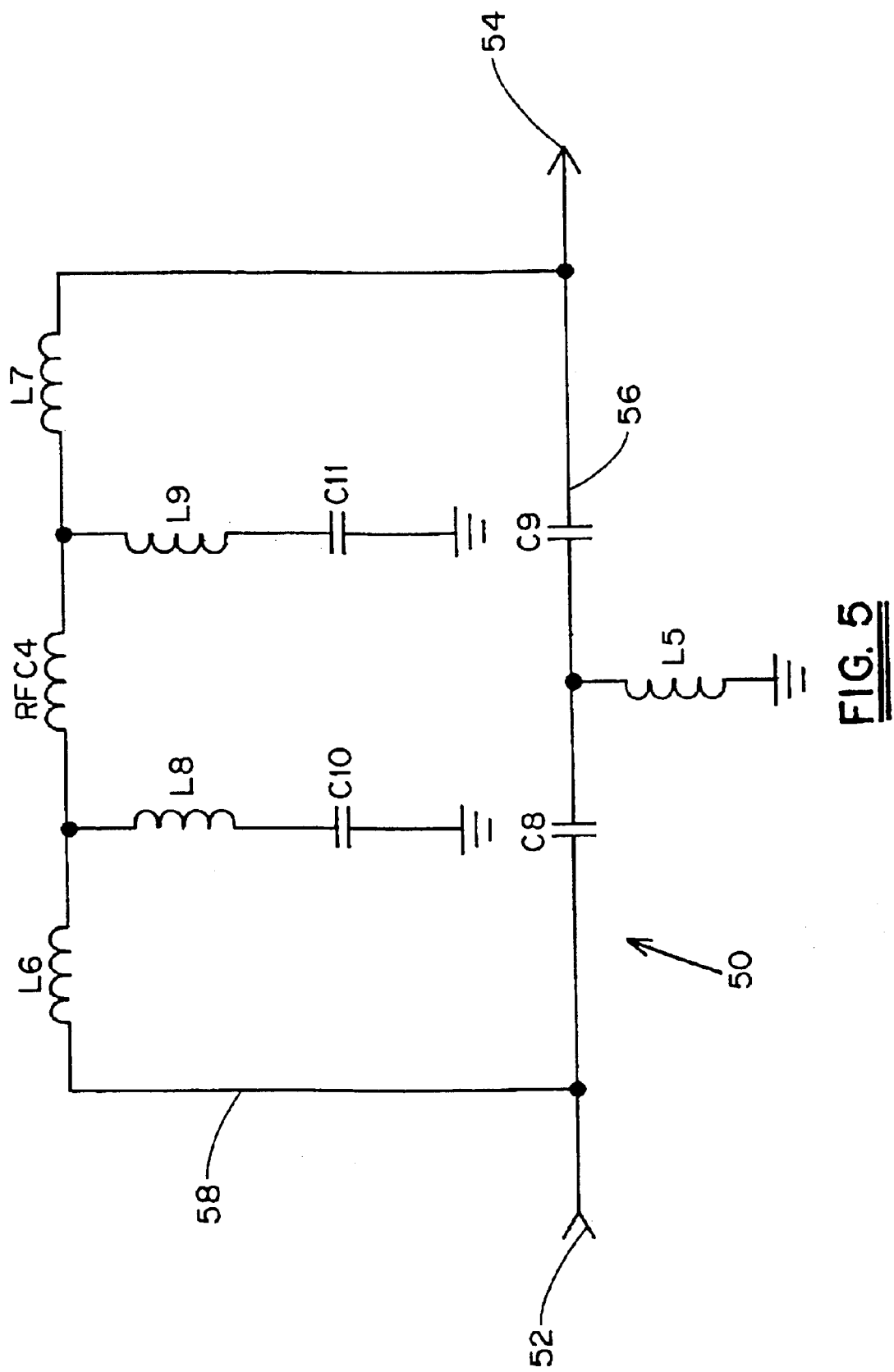

STEP ATTENUATOR USING FREQUENCY DEPENDENT COMPONENTS AND METHOD OF EFFECTING SIGNAL ATTENUATION

BACKGROUND OF THE INVENTION

The present invention relates to means and methods of attenuating electrical signals over a predetermined frequency range. In a typical application, the invention relates to signal attenuation in communication systems having forward and return paths, such as those commonly used in CATV applications, and more particularly to novel circuits and methods for introducing a desired step attenuation (flat loss) in the return path signal or in both forward and return path signals.

In multi-channel communication systems it is common to transmit signals at frequencies higher than a predetermined value from an input to an output end over what is termed a forward path, and to transmit signals at frequencies below the predetermined value from the output back to the input end over a so-called return path. In order to improve network performance and reduce noise ingress, it is desirable to attenuate signals in the return path by a substantially uniform amount over the range of return path frequencies. Forward path signals are most commonly transmitted substantially unimpeded, i.e., without attenuation, although in some applications it may be desirable to attenuate the signals over the full frequency band of both forward and return path signals. Such communication systems, particularly as employed in the field of CATV, are well known and a number of systems have been devised to provide the step attenuation (flat loss) in the transmitted signals.

Diplex filters, for example, have been used for processing both the forward and return paths in CATV communication systems. U.S. Pat. No. 5,745,838 to Tresness et al. discloses a special form of diplex filter including fixed-value resistors in a TEE or PI configuration which attenuates signals in the return path by a predetermined amount. The fixed resistors providing the attenuation operate, of course, independently of frequency.

The present invention is directed to apparatus and methods for effecting step attenuation of return path, or both forward and return path signals in two way communication systems through the use of a return path filter network having only frequency dependent components. The invention provides a number of advantages over prior art circuits which perform this function using a fixed resistors. Such advantages include: reducing the number of circuit components, reducing filter size and cost, and/or increasing the filter's electric surge and power handling capabilities.

SUMMARY OF THE INVENTION

The filter apparatus of the invention includes input and output ends connected, for example, to the head end and subscriber terminal, respectively, of a cable television system, as well as the usual forward and return communication paths. The filter's forward path includes series-connected capacitors, as in the prior art, providing a high-pass filter for passing signals above a predetermined frequency, e.g., RF television signals, to the subscriber end. The invention is based on designing the return path filter network using frequency dependent components to provide a desired amount of signal attenuation. In the disclosed embodiment, electromagnetic RF chokes replace traditional, fixed-value resistors and associated inductors, thus providing the desired attenuation while realizing the aforementioned improvements over corresponding, prior art filters. The RF chokes provide a combined response having both inductance and impedance characteristics, which is frequency dependent, as opposed to the purely resistive, frequency independent response of the prior art return path filters. By choosing from a wide variety of commercially available RF chokes, the amount of flat loss as well as optimization of overall network performance can be achieved.

The foregoing and other features of the invention will be more readily understood and fully appreciated from the following detailed description, taken in conjunction with the accompanying drawing.

BRIEF DESCRIPTION OF THE DRAWING

FIG. 5 is an electrical schematic of an alternate embodiment of the circuit of the invention.

DETAILED DESCRIPTION

Figure 1:
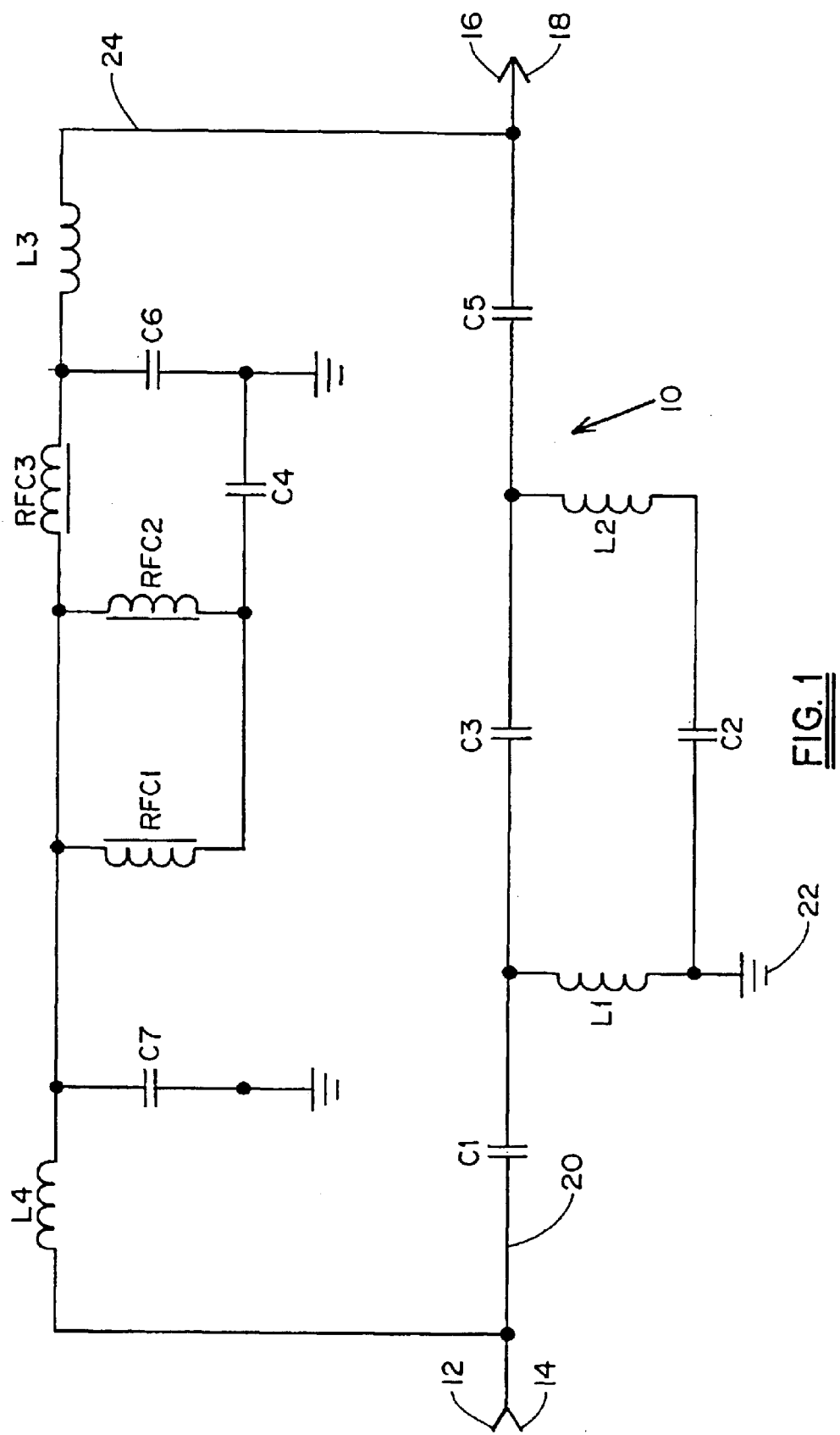
FIG. 1 is an electrical schematic of a circuit embodying the filter of the invention to provide attenuation of return path or, with proper selection of component values, both forward and return path signals.

Referring now to the drawings, in FIG. 1 is shown a filter circuit denoted generally by reference numeral 10 connected on one side to forward path signal source 12 and to data receiver 14. At the other side, filter 10 is connected to forward path signal receiver 16 and to return path signal source 18. In a typical application, forward path signal source 12 may be the head end of a CATV system and receiver 16 may be a television receiver, while return path signal source 18 may be a subscriber terminal transmitter (e.g., set-top addressable converter) obtained from the cable service provider, and receiver 14 an appropriate device for receiving and processing signals from source 18.

Filter 10 includes one branch 20 having series-connected capacitors C1, C3 and C5, with inductors L1 and L2 connected in parallel on opposite sides of capacitor C3. Capacitor C2 is connected in parallel with capacitor C3 and is connected, together with inductor L1, to ground at 22. The values of capacitors C1, C2, C3 and C5 and inductors L1 and L2 are chosen to form a filter which passes signals in the frequency range (e.g., 50 to 1,000 MHz) of forward path communication, i.e., the range of signals emanating from source 12 and received by receiver 16. A second branch 24 includes series connected inductors L3 and L4 which, together with capacitors C6 and C7, respectively, provide a filter limiting the frequency band of signals carried by branch 24, i.e., the return path signals, to the desired frequency range, e.g., 5 to 40 MHz.

Interposed between the connections of capacitors C6 and C7 to branch 24 are the circuit components providing attenuation of return path signals, namely, RF chokes RFC1, RFC2 and RFC3. Capacitor C4 is also incorporated in the attenuation circuit to allow power to pass; that is, the presence of capacitor C4 prevents the grounding of all power. The RF chokes have both impedance and inductance characteristics, and are frequency dependent. That is, the amount of attenuation introduced by the RF chokes is a function of frequency. Inductors and capacitors are other examples of frequency dependent components, whereas the fixed resistors used to provide attenuation of signals in prior art two-way communication systems are frequency independent. Use of a frequency dependent component to provide the desired attenuation permits replacement of two components (e.g., a fixed resistor and inductor typically used in prior art step attenuators) with a single component, such as an RF choke. The number and electrical values of RF chokes and manner of connection in branch 24 is a function of the desired amount of attenuation over the frequency band established by inductor/capacitor pairs L3-C6 and L4-C7 and may be calculated by well known techniques.

Figure 2:
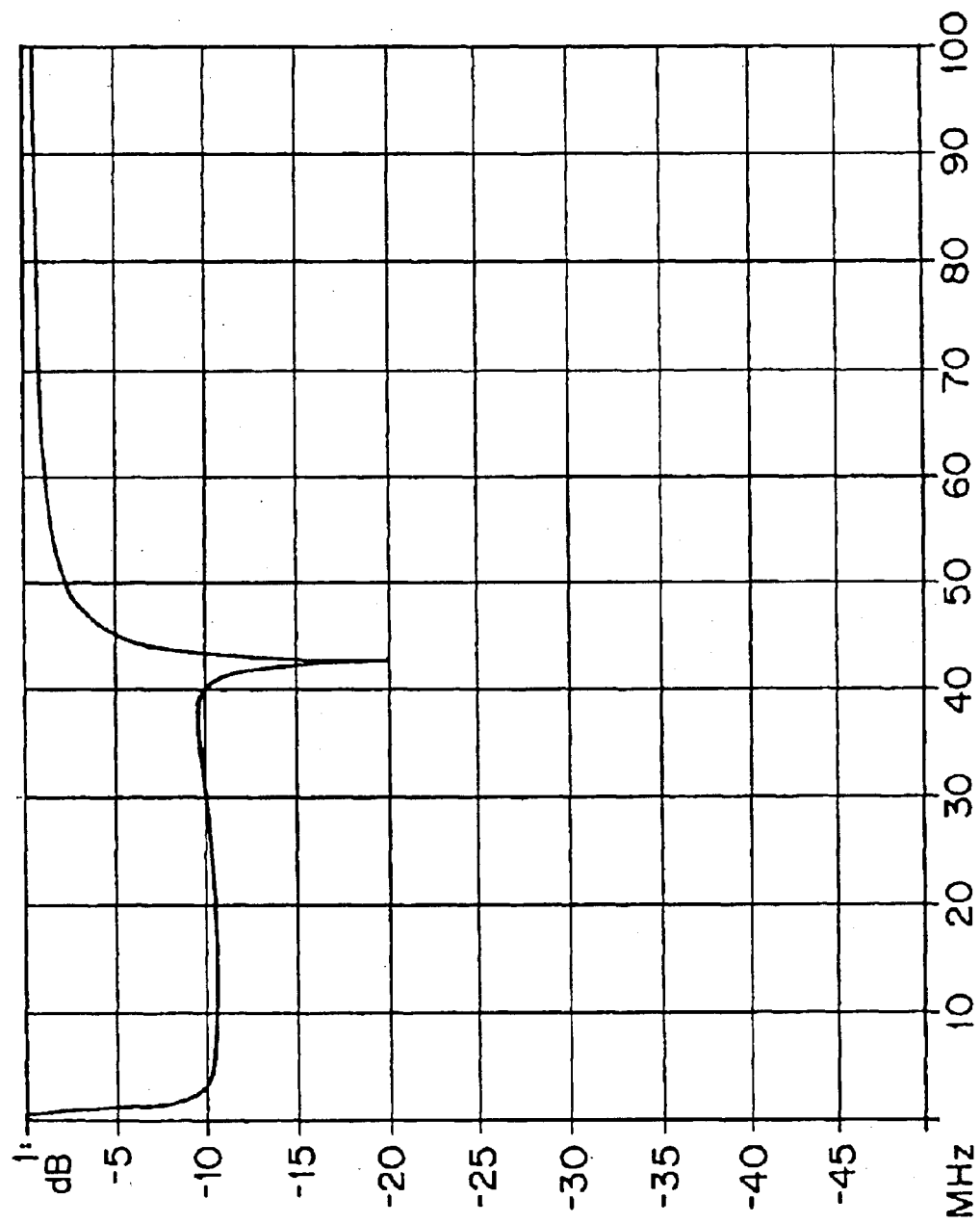
FIG. 2 is a graph showing a typical attenuation/frequency relationship, or insertion loss, of the filter of FIG. 1.

FIG. 2 provides a graphical depiction of the frequency/attenuation relationship of the circuit of FIG. 1. Signals in the 5–40 MHz range, i.e., return path signals, are attenuated by a substantially uniform 10 decibels, while signals above the 50 MHz level experience little or no attenuation. This effect is achieved with a circuit which is typically smaller and less expensive than prior art circuits providing the same attenuation effects.

Figure 3:
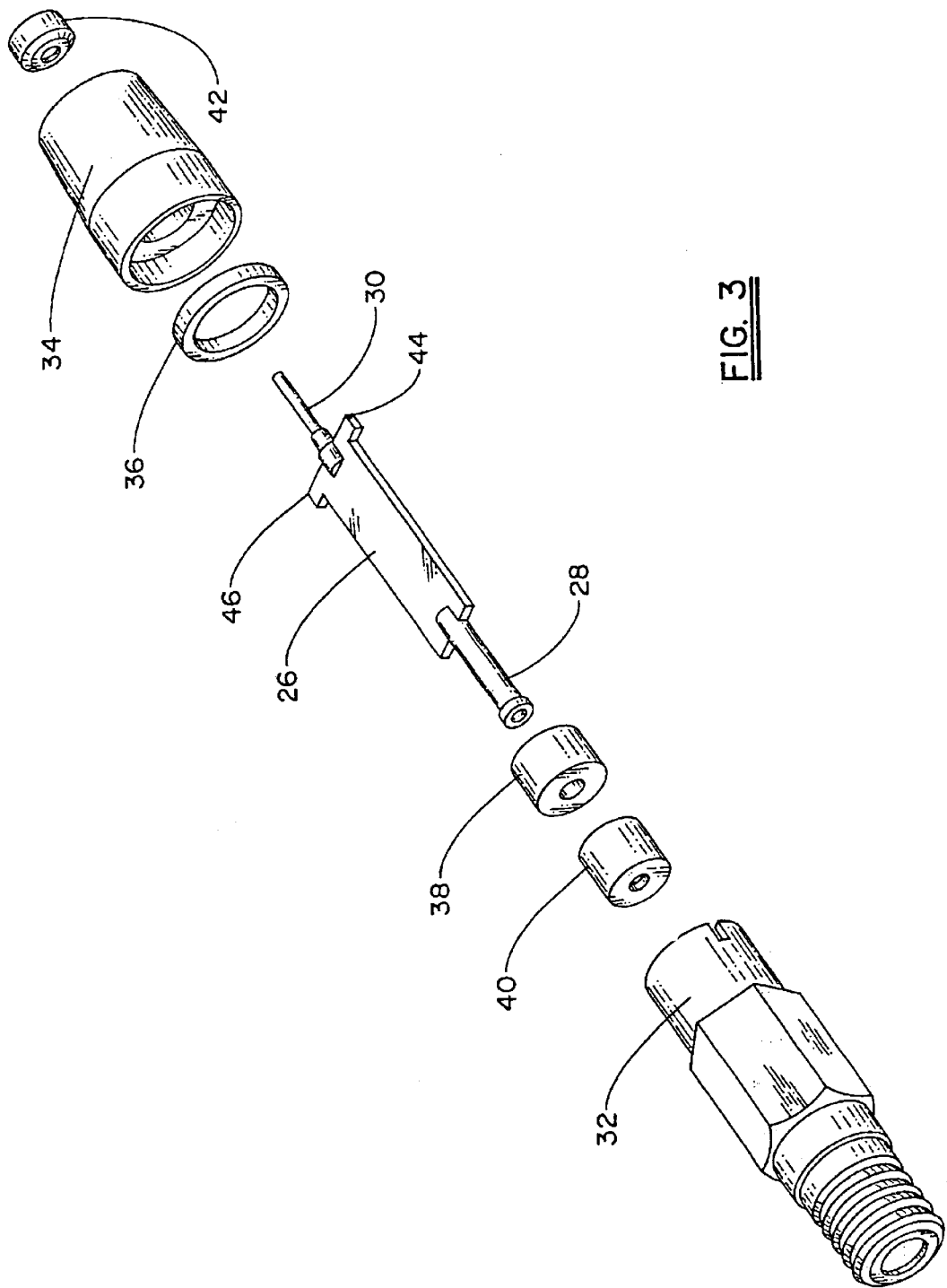
FIG. 3 is an exploded perspective view showing a typical embodiment of a filter assembly including a circuit embodying the present invention.

In FIG. 3 is shown a filter assembly incorporating the invention in a typical, physical embodiment. The circuit shown schematically in FIG. 1, or other circuit configuration of the invention, is formed by surface-mount components on both surfaces of printed circuit board 26, together with the electrical paths (traces) on the board interconnecting such components with one another and the input, output and grounding contacts. Female and male connectors 28 and 30, respectively, are connected both mechanically and electrically in the usual manner to circuit board 26. Board 26 is positioned within a housing consisting of two members 32 and 34 which are mutually assembled and held in permanently engagement by means of solder preform 36. The interior of the housing is sealed against entry of moisture and foreign matter, and the connectors are insulated from the housing, by seal 38 and insulators 40 and 42. The circuit is electrically grounded by soldered connection of housing member 32 with portions of the electrical paths on one or both of tabs 44 and 46 of board 26.

Figure 4A:
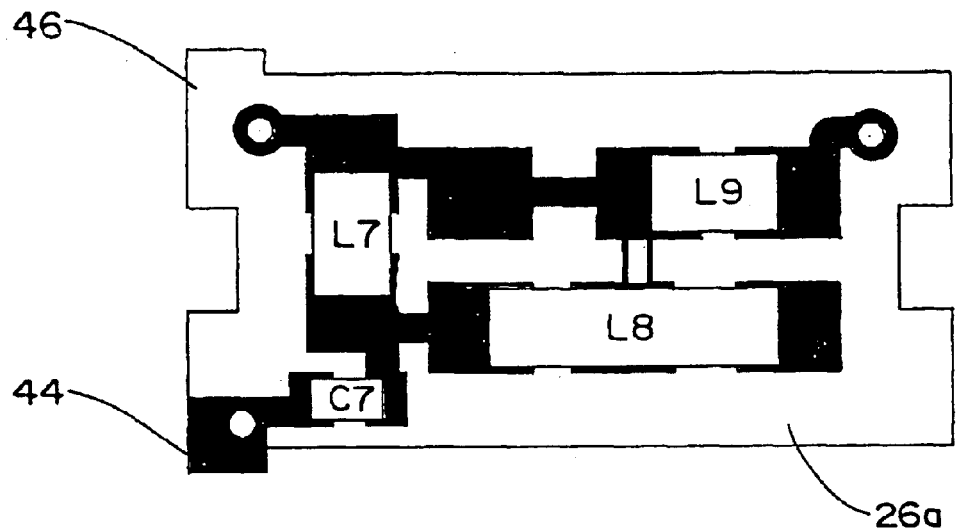
FIGS. 4a and 4b are plan views of opposite sides of a circuit board showing a typical layout of components which embody the circuit of the invention.
Figure 4B:
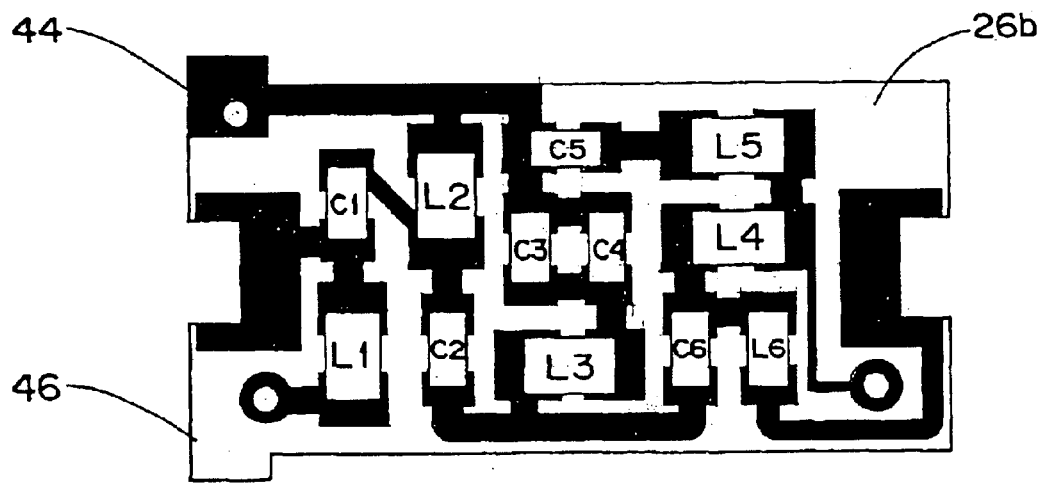

FIGS. 4a and 4b provide an illustration of a typical layout of surface-mount components on opposite surfaces 26A and 26B of circuit board 26. Although not physically identical to the circuit shown schematically in FIG. 1, the circuit formed by capacitors C1–C6 and inductors L1–L6 on surface 4b, and capacitor C7 and inductors L7, L8 and L9 on surface 4a is another example of the circuit of the invention. The components indicated at L7, L8 and L9 may in practice be RF chokes, such as described in connection with FIG. 1, or may be inductors in the usual sense which, as previously mentioned, serve as frequency dependent components in providing the desired attenuation.

Figure 6:
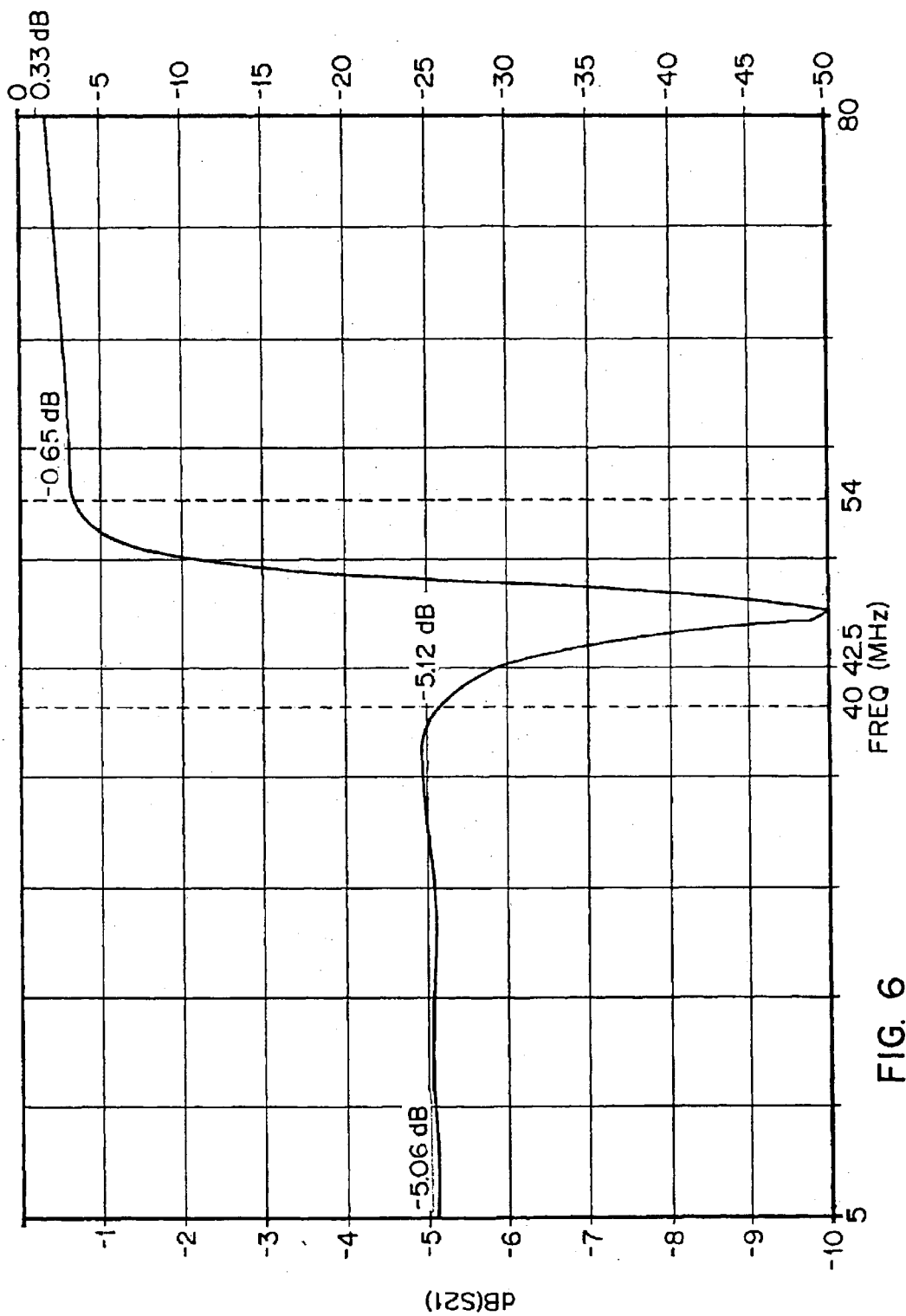
FIG. 6 is a graph showing a typical attenuation/frequency relationship of the circuit of FIG. 5.

An alternate embodiment of the filter circuit, denoted generally by reference numeral 50, is shown schematically in FIG. 5. Terminals 52 and 54, are connected to forward and return path signal sources, respectively, as before. Capacitors C8 and C9 are connected in series in circuit branch 56 and inductor L5 is connected to ground between these two capacitors. Circuit branch 58 includes inductors L6 and L7, each connected on one side to terminals 52 and 54, respectively. The single component providing attenuation of return path signals, namely, RF choke RFC4, is connected between inductors L6 and L7. Series connected inductor L8 and capacitor C10 are connected at one end to the line between inductor L6 and choke RFC4 and at the other end to ground. Likewise, inductor L9 and capacitor C11 are connected to the line between choke RFC4 and inductor L7 and to ground. As indicated by the graph of FIG. 6, the return loss for this embodiment is not as good as that of the previously described embodiment. However, the circuit is fully operative and uses fewer components than the circuit of FIG. 1, having only a single, frequency dependent component (RFC4) providing a predetermined level of attenuation over a range of signal frequencies.

Although filters providing step attenuation in two way communication systems have predominantly been directed to return path signals, it is sometimes desirable to attenuate signals in the forward path as well. The circuit of FIG. 1 may be designed to attenuate signals across the full frequency range of both forward and return path frequencies by selection of proper values of the components using well known electrical design principles. Thus, the circuit of FIG. 1, and equivalent circuits, will provide substantially uniform attenuation of signals over a desires frequency band using components which are frequency dependent with resulting advantages in size and cost. It is further apparent that the filter circuit may conveniently embodied in a plurality of components which are surface mounted upon a very small circuit board with the component(s) providing the attenuation mounted upon one surface and all or most of the other components mounted upon the opposite surface.

What is claimed is:

1. In a two-way communication system having forward and return paths for signals of respective, first and second frequency ranges, means for attenuating signals in at least one of said ranges, said means consisting of at least one frequency dependent component.

2. The attenuating means of claim 1 wherein the level of said attenuation is substantially constant over said at least one of said ranges.

3. The attenuating means of claim 1 wherein said at least one of said ranges is said second range.

4. The attenuating means of claim 3 wherein said at least one component is an RF choke.

5. The attenuating means of claim 4 wherein said at least one component is a plurality of RF chokes.

6. In a two-way communication system having forward and return paths for signals of respective, first and second frequency ranges, means for attenuating signals in at least one of said ranges, said means comprising at least one frequency dependent component;

wherein said at least one of said ranges is said second range;

wherein said at least one component is an RF choke; and wherein said at least one component is a single RF choke.

7. The method of attenuating electrical communications signals over a predetermined range of frequencies which pass through a filter circuit, said method comprising including within said circuit at least one frequency dependent component having a value appropriate to providing a predetermined level of attenuation over said range;

wherein said frequency dependent component is a single RF choke.

8. A filter circuit through which electrical communication signals of a first range of frequencies pass, said circuit consisting of at least one frequency dependent component which serves to attenuate, by a predetermined substantially constant level, signals having frequencies within said first range.

9. The circuit of claim 8 wherein said frequency dependent component comprises at least one RF choke.

10. The circuit of claim 8 wherein said frequency dependent component comprises at least one inductor.

11. The circuit of claim 10 wherein said frequency dependent component comprises three inductors.

12. The circuit of claim 8 wherein said first range of frequencies corresponds to the range of frequencies in the return path of a two-way communications system.

13. A filter circuit through which electrical communication signals of a first range of frequencies pass, said circuit including at least one frequency dependent component which serves to attenuate by a predetermined, substantially constant level signals having frequencies within said first range;

wherein said frequency dependent component comprises at least one RF choke;

wherein said frequency dependent component comprises three RE chokes.

14. The circuit of claim 13 wherein said RF chokes are ferrite chokes.

15. A filter circuit through which electrical communication signals of a first range of frequencies pass, said circuit including at least one frequency dependent component which serves to attenuate by a predetermined, substantially constant level signals having frequencies within said first range;

wherein said frequency dependent component comprises at least one RF choke;

wherein said frequency dependent component comprises a single RF choke.

16. A filter assembly for use in CATV applications, said filter comprising:

a) a printed circuit board having opposite, planar surfaces;

b) a filter circuit comprised of a plurality of surface mount components mounted upon each of said surfaces;

c) a housing within which said circuit board is positioned;

d) said filter circuit consisting of a first plurality of frequency dependent components establishing a predetermined range of signal frequencies which pass through said circuit;

e) wherein at least one of said frequency dependent components establishes a predetermined level of attenuation of signal frequencies within said predetermined range.

17. The filter assembly of claim 16 wherein said frequency dependent component comprises at least one RF choke.

18. The filter assembly of claim 16 wherein said frequency dependent component comprises at least one inductor.

19. The filter assembly of claim 16 wherein each of said first plurality of components is either a capacitor or an inductor.

20. A filter assembly for use in CATV applications, said filter comprising:

a) a printed circuit board having opposite, planar surfaces;

b) a filter circuit comprised of a plurality of surface mount components mounted upon each of said surfaces;

c) a housing within which said circuit board is positioned;

d) said filter circuit including a first plurality of components establishing a predetermined range of signal frequencies which pass through said circuit; and e) at least one frequency dependent component establishing a predetermined level of attenuation of signal frequencies within said predetermined range;

wherein said frequency dependent component comprises at least one RF choke;

wherein said frequency dependent component comprises a single RF choke.

21. A filter assembly for use in CATV applications, said filter comprising:

a) a printed circuit board having opposite, planar surfaces;

b) a filter circuit comprised of a plurality of surface mount components mounted upon each of said surfaces;

c) a housing within which said circuit board is positioned;

d) said filter circuit including a first plurality of components establishing a predetermined range of signal frequencies which pass through said circuit; and e) at least one frequency dependent component establishing a predetermined level of attenuation of signal frequencies within said predetermined range;

wherein said frequency dependent component comprises at least one RF choke;

wherein substantially all of said first plurality of components is mounted upon one of said opposite surfaces and said frequency dependent component is mounted upon the other of said opposite surfaces.

22. A filter assembly for use in CATV applications, said filter comprising:

a) a printed circuit board having opposite, planar surfaces;

b) a filter circuit comprised of a plurality of surface mount components mounted upon each of said surfaces;

c) a housing within which said circuit board is positioned;

d) said filter circuit including a first plurality of components establishing a predetermined range of signal frequencies which pass through said circuit; and e) at least one frequency dependent component establishing a predetermined level of attenuation of signal frequencies within said predetermined range;

wherein said frequency dependent component comprises at least one RF choke;

wherein said frequency dependent component comprises three RF chokes.

23. The method of attenuating electrical communications signals over a predetermined range of frequencies which pass through a filter circuit, said method comprising the step of providing within said circuit only at least one frequency dependent component having a value appropriate to providing a predetermined level of attenuation over said range.

24. The method of claim 23 wherein said frequency dependent component is a plurality of RF chokes.

* * * * *